United States Patent [19]

Borcea et al.

[11] Patent Number: 4,950,011
[45] Date of Patent: Aug. 21, 1990

[54] TOOL FOR PRECISELY POSITIONING A WORKPIECE

[76] Inventors: Nicky Borcea, 95 Steep Hill Rd., Weston, Conn. 06883; Alexander D. Ionescu, 190 Sport Hill Rd., Easton, Conn. 06612

[21] Appl. No.: 261,499

[22] Filed: Oct. 24, 1988

[51] Int. Cl.[5] ............................................. H05K 3/32
[52] U.S. Cl. ..................................... 294/2; 294/64.1; 294/116; 29/743
[58] Field of Search .................... 294/2, 64.1, 86.13, 294/86.15, 86.25, 86.26, 86.28, 86.29, 86.3, 114, 116, 88; 29/740, 743

[56] References Cited

U.S. PATENT DOCUMENTS

| | | | |
|---|---|---|---|
| 4,473,247 | 9/1984 | Itemadani et al. | 294/64.1 X |
| 4,527,327 | 7/1985 | Van Deuren | 294/2 X |
| 4,599,037 | 7/1986 | Ross, Jr. et al. | 294/2 X |
| 4,705,311 | 11/1987 | Ragard | 294/2 |
| 4,753,004 | 6/1988 | Fujioka | 294/2 X |
| 4,759,124 | 7/1988 | Snyder et al. | 294/2 X |

OTHER PUBLICATIONS

IBM Technical Disclosure Bulletin, vol. 32, No. 1, Jun. 1989.

Primary Examiner—Johnny D. Cherry
Assistant Examiner—Dean J. Kramer
Attorney, Agent, or Firm—Arthur T. Fattibene

[57] ABSTRACT

A tool for precisely positioning a workpiece upon a related component part that includes a housing having reciprocally mounted therein a piston and an associated piston. Connected to and mounted for relative movement therewith is a nozzle which is arranged to attach to a workpiece when a negative pressure is imparted to the nozzle. Circumferentially spaced about the housing are at least two pairs of complementary fingers that are sequentially actuated to effect the sequential positioning of the workpiece held on the end of the nozzle along a first and second axis relative to the nozzle. The arrangement is such that the precise positioning of the workpiece on the end of the nozzle is effected in translating the workpiece from its pick-up position to its deposit position where the workpiece is precisely positioned upon its receiving component part. Included are adjustment features for effecting the precise positioning of the workpiece relative to the nozzle to insure the accurate positioning of the workpiece on its related component part.

11 Claims, 4 Drawing Sheets

TOOL FOR PRECISELY POSITIONING A WORKPIECE

FIELD OF THE INVENTION

This invention is directed to a robotic like tool for picking up a workpiece and translating the workpiece to a location at which the workpiece is precisely positioned upon a related component part. More specifically to a tool wherein the workpiece is precisely oriented on the end of the tool along a first and second axis as the workpiece is being translated.

PROBLEM AND PRIOR ART

Heretofore, various effects have been made for picking up a workpiece and translating the same to effect the assembly of a particular product. Where the precise positioning of one component part relative to another related part is critical, e.g. in the electronics industry wherein minute chips are required to be precisely located on a given substrate or printed circuit board and such, considerable difficulties have been encountered in effecting the precise positioning of such parts or workpieces. U.S. Pat. No. 4,135,630 discloses an effort for locating a chip on a substrate. While the device disclosed in said patent may be satisfactory in certain applications, it is subject to certain limitations.

OBJECTS

An object of this invention is to provide a tool for precisely positioning a workpiece on the end thereof in a predetermined oriented position with respect thereto in a sequential manner.

Another object is to provide a tool in which a workpiece is positively positioned on the end of the tool and is positively maintained in its predetermined position on the end of the tool.

Another object is to provide a tool for precisely positioning a workpiece on the end of the tool by first locating the workpiece along a first axis thereof, and then along a second axis thereof in a sequential manner by a single linear motion.

Another object is to provide a tool in which the position of the workpiece relative to the end of the tool is positively maintained in the operative position of the tool.

Another object is to provide a tool for effecting the precise positioning of a workpiece in a positive and relatively inexpensive manner.

Another object is to provide a tool capable of more accurately positioning a workpiece thereon.

Another object is to provide a tool which can be readily adjusted for more precisely locating a workpiece on the end therein in a particular predetermined manner.

Another object is to provide a tool which is relatively inexpensive to fabricate and which is positive and accurate in operation.

SUMMARY OF THE INVENTION

The foregoing objects and other features and advantages are attained by a tool that includes a housing having a piston shaft and connected piston reciprocally mounted therein. Connected for relative movement with respect to the piston shaft in a non-rotatable manner is a nozzle which is subjected to a negative pressure for picking up and maintaining a workpiece adhered to the end of the nozzle and by which the workpiece can be translated to and deposited upon a related component part. For aligning the workpiece along a first and second axis thereof relative to the nozzle, two pairs of oppositely disposed locator fingers are circumferentially spaced about the housing in suitable elongated slots. The respective fingers are pivotably connected to the housing intermediate the opposed ends thereof. The gripping ends of the respective fingers are circumferentially spaced so that the closing of the first and second pair of fingers onto the workpiece will effect the alignment of the workpiece along the first axis and the second axis relative to the nozzle. The actuation of the respective pairs of fingers in sequence is effective by a first and second actuating cam mounted on the piston shaft to engage a complementary cam surface connected to the respective end of the respective pairs of fingers. To effect adjustment of the corresponding pair of fingers, the ends of the respective fingers are bifurcated at one end and are provided with an adjusting screw to vary the setting of the respective fingers relative to the nozzle and each other. The arrangement is such that the pairs of fingers are sequentially actuated by a single stroke of the piston and connected piston shaft so that the respective pairs of fingers closing onto the workpiece are positively maintained throughout their respective workpiece engaging position to prevent any shifting of the workpiece from its orientated position on the end of the nozzle during the translation thereof. The respective fingers are arranged about the housing in their respective slots to prohibit relative lateral displacement thereof.

FEATURES

A feature of this invention resides in the provision wherein the respective pairs of fingers are positively maintained in their respective gripping position to maintain the axial alignment of the workpiece held therebetween.

Another feature resides in the ability to effect adjustment of the fingers relative to the center of the nozzle.

Another feature resides in the provision of the respective pairs of fingers being sequentially actuated by a single reciprocal movement of the piston and connected piston shaft.

Another feature of the invention resides in the provision wherein the working motion of the fingers is effected by a cam action in which the camming action is maintained throughout the working motion of the fingers.

Another feature resides in maintaining the fingers within complementary longitudinally extending slots formed in the outer wall of the housing to prohibit lateral displacement of the fingers.

Another feature resides in the provision that the nozzle is non-rotatable.

Another feature resides in the provision wherein the tool can be fabricated in a relatively simple and inexpensive manner.

Another feature resides in the provision that the positioning of the workpiece upon a related component part is rendered positive and accurate.

Other features and advantages will become more readily apparent when considered in view of the drawings and following description.

IN THE DRAWINGS

DETAILED DESCRIPTION

Figure 1:
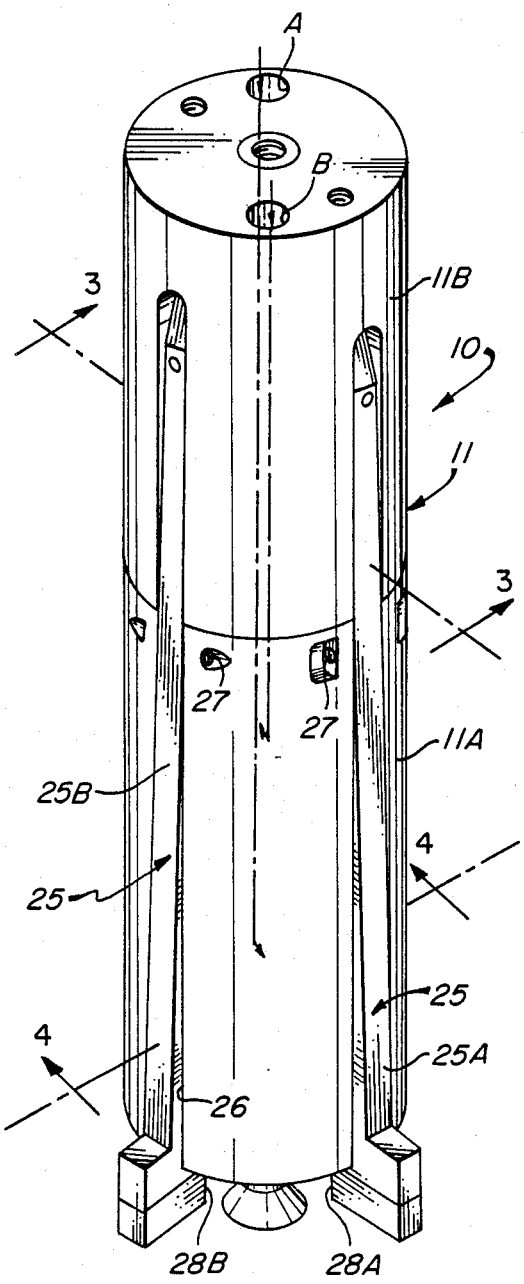
FIG. 1 is a perspective side view of a tool embodying the invention.
Figure 2:
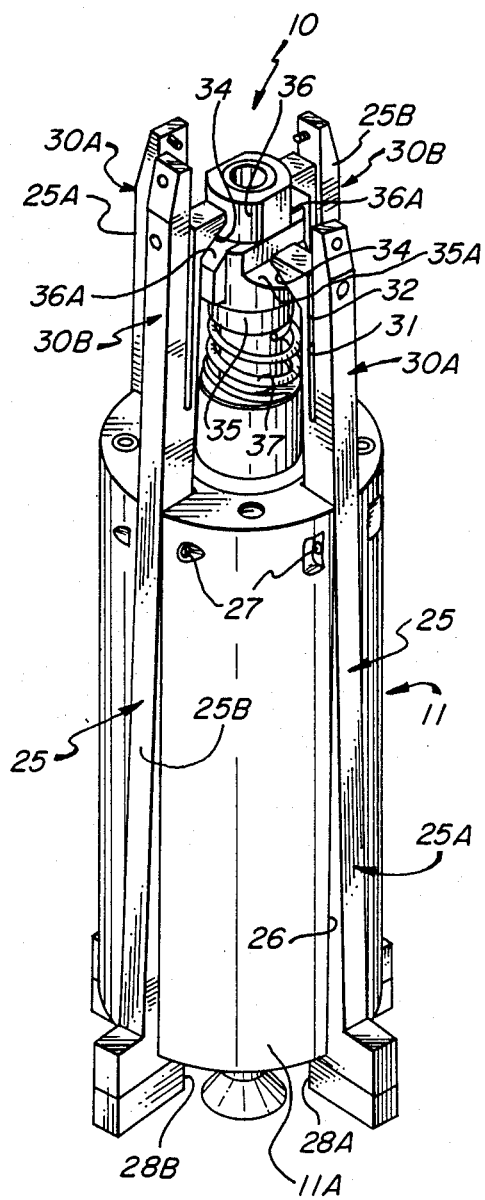
FIG. 2 is a view similar to FIG. 1 with the cap of the housing removed.
Figure 3:
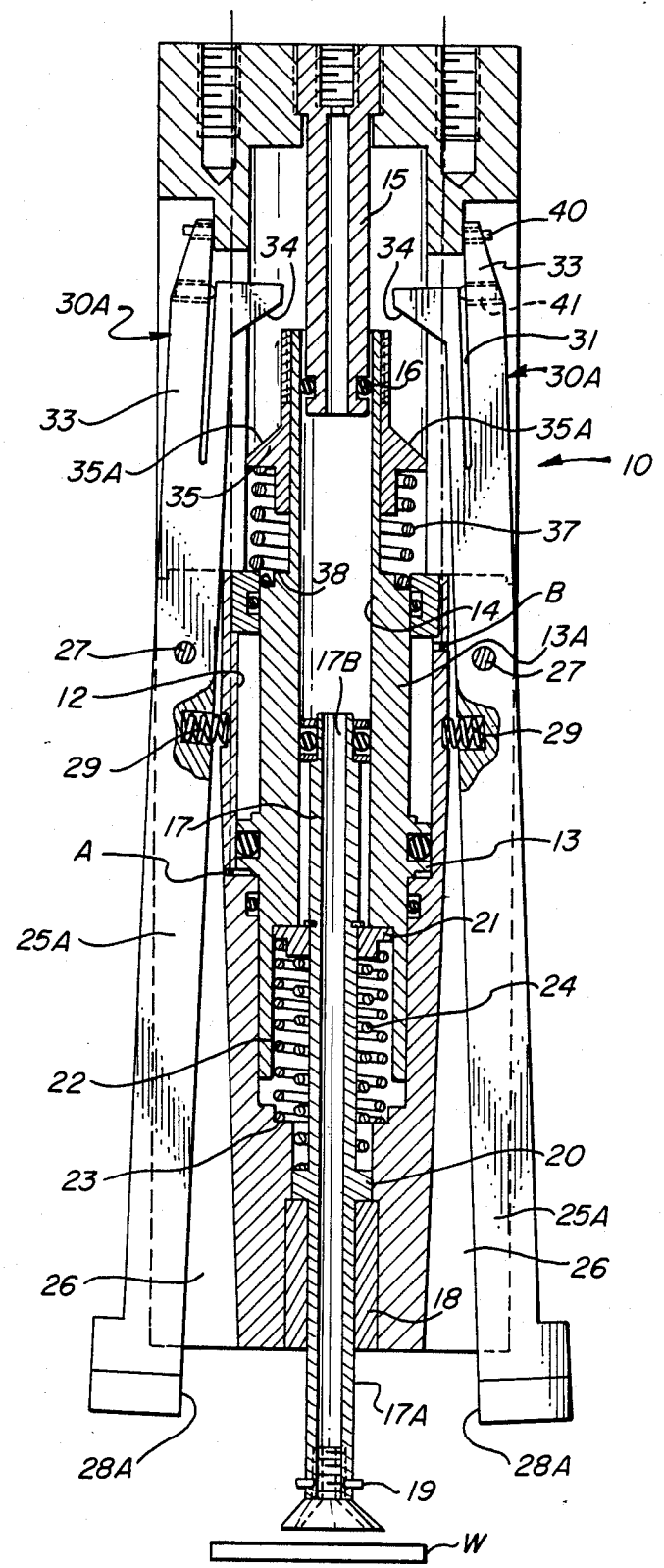
FIG. 3 is a sectional view taken along line 3—3 on FIG. 1.
Figure 4:
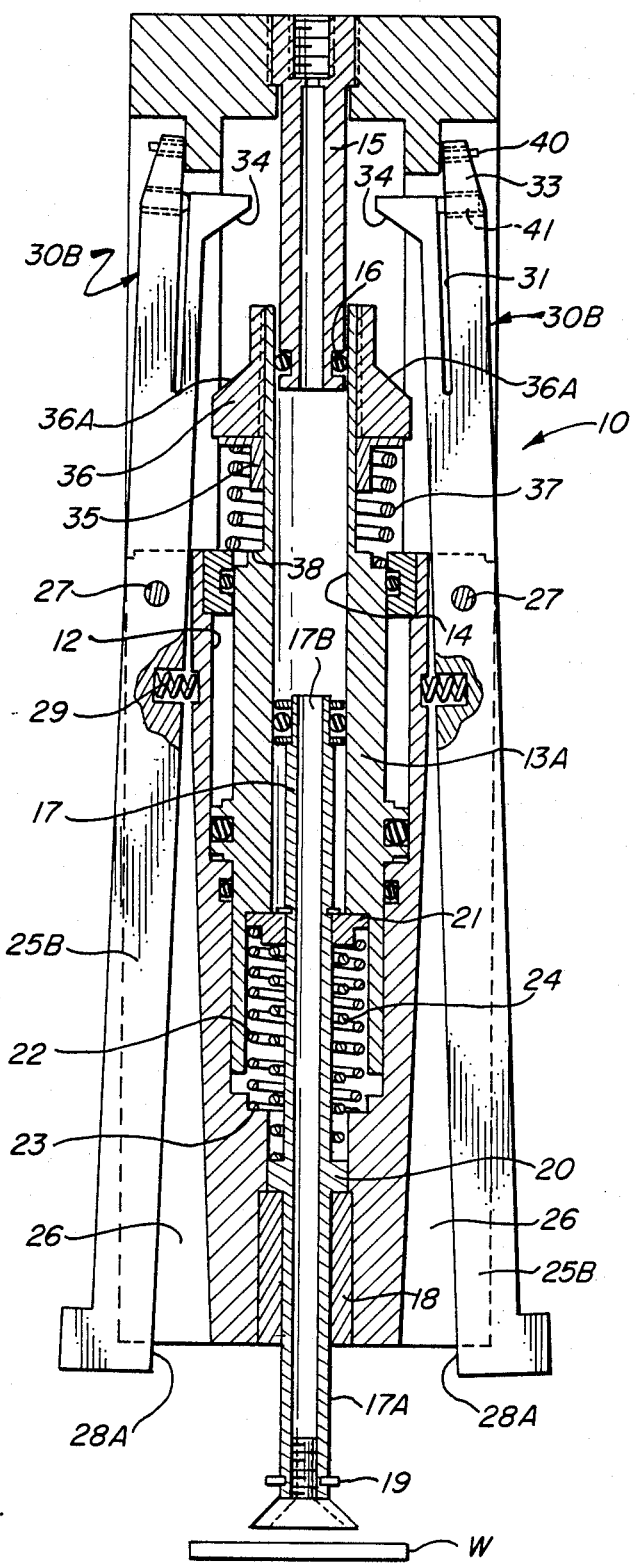
FIG. 4 is a sectional view taken along line 4—4 on FIG. 1
Figure 5:
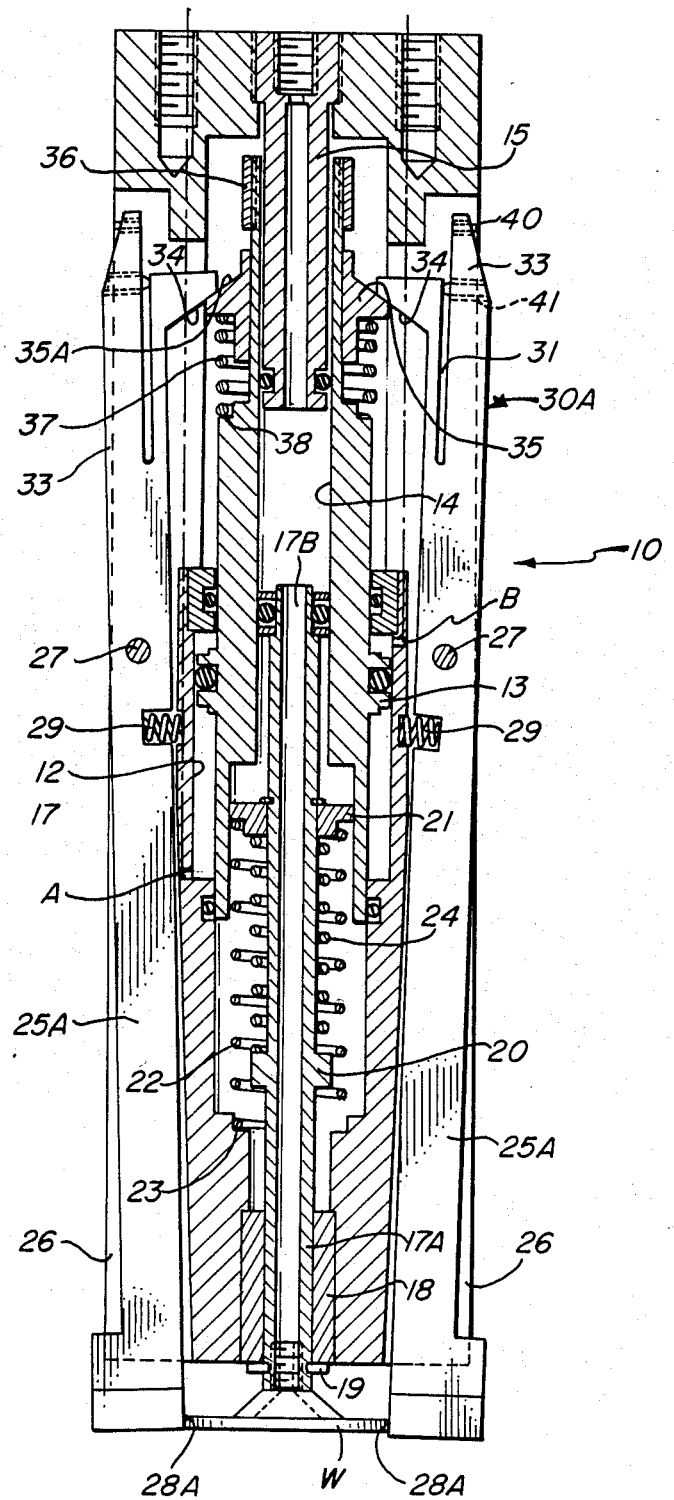
FIG. 5 is a sectional view taken along line 3—, but illustrating the tool in an operative position.

Referring to the drawings, there is shown in FIGS. 1 to 5 a tool 10 embodying the invention. The tool comprises a housing 11 consisting of a lower body portion 11A and a complementary upper or cap portion 11B. Referring to FIGS. 3 and 4, the housing 11 is provided with a cylinder bore 12 in which a piston 13 and connected piston shaft 13A is reciprocably mounted. As shown, the piston shaft 13A is provided with a longitudinally extending bore or passageway 14 extending therethrough. The upper end of the piston shaft is slidably disposed in communication with a depending tube 15 connected to the cap 11B. As will be hereinafter defined, the tube 15 defines the inlet for connection with a source of negative pressure, not shown. A suitable sealing ring 16 is disposed about the end of tube 15 and the upper end of the piston shaft 13A.

Connected in communication with the other end of the piston shaft is a nozzle 17 which is mounted for relative movement with respect to the piston shaft 13A. As shown, the nozzle 17 comprises a tubular member which extends beyond the lower end of the housing 11. The extended end 17A of the nozzle is provided with a rectangular cross-sectional shape which is fitted in a complementary rectangular bushing 18 fitted in the end of the housing 11. Connected to the extended portion 17A of the nozzle is a stop ring 19. Intermediate the length of the nozzle, there is provided a lateral shoulder portion 20 arranged to engage the inner end of bushing 18 and functions as a stop to limit the outward movement of the nozzle 17. The nozzle is provided with an internal bore 17B which is in open communication with tube 15. Slidably mounted on the nozzle 17 is a stop collar 21; and which stop collar 21 is maintained in a normally biased position by a compression spring 22 which is seated between the collar 21 and a shoulder 23 formed on the inner wall of the housing 11. An inner spring 24 is concentrically disposed about the nozzle 17 within spring 22, and the inner spring 24 is maintained between the bottom of the collar 21 and the stop shoulder 20 on nozzle 17. As will be hereinafter described, the inner spring 24 allows for positive Z axis compliance during the placement of a workpiece W onto a related component part.

Accuation of the piston is effected by the introduction of a fluid pressure medium, e.g. compressed air through ports A and B disposed on opposite sides of the piston 13. It will be understood that ports A and B are connected to a suitable source of a pressure medium. In the illustrated embodiment, the ports A and B are preferably disposed in communication with channels which connect to suitable fittings A1 and B1 respectively located in the top of the end cap 11B. Thus, in the illustrated embodiment, all of the connections with the fluid pressures necessary to operate the tool 10 can be made at the end cap 11B.

It will be understood that the tool 10 is an attachment to a robotic type machine which will translate the tool 10 between the workpiece supply or feed station, not shown, and the positioning station, not shown, where the workpiece is deposited upon a related component part; and wherein the tool 10 functions as a hand to pick up the workpiece, and accurately positions or orients the workpiece W on the end of the nozzle 17 as the workpiece is translated from the pick-up station to the positioning station.

As best seen in FIG. 2, locating means are circumferentially spaced about the housing 11. In the illustrated embodiment, the locating means comprises a plurality of locator fingers 25. The locator fingers 25 are coupled in pairs, e.g. 25A—25A and 25B—25B, each finger of the respective pairs 25A, 25A and 25B, 25B are disposed on opposite sides of the nozzle 17. Longitudinally extending grooves 26 formed in the outer wall of the housing body 11A and associated cap 11B define a seat for receiving the corresponding finger. In accordance with this invention, each of the respective fingers 25A, 25A and 25B, 25B are pivotably connected to the housing 11 intermediate the ends thereof by a pivot pin 27. The lower ends of the respective finger pairs define a gripping end portion 28A and 28B between which a workpiece is gripped thereby. As will be hereinafter described, the gripping ends 28A, 28A of fingers 25A, 25A will function to position a workpiece W therebetween along a first axis thereof and fingers 25B, 25B function to orient or position the workpiece along a second axis relative to the nozzle 17, so as to establish the proper predetermined position of the workpiece W at which the workpiece is to be placed onto the related component part. A spring 29 disposed between the respective locator fingers and the housing located below the pivot 27 functions to bias the respective gripping ends 28A and 28B of the respective pairs of fingers toward a normal open or inoperative position. The respective upper ends of the locator fingers define an actuating end portion 30A and 30B. The actuating end portions 30A, 30B of the respective fingers 25A, 25B are each provided with a longitudinally extending slit 31 to bifurcate the upper end of the fingers to define a flexible leaf portion 32 and a relatively rigid portion 33. Connected to each of the respective flexible leaf portion 32 is an inwardly projecting incline cam surface 34. As best seen in FIG. 3, the cam surfaces 34—34 of fingers 25A, 25A are oppositely disposed, and as seen in FIG. 4, the cam surfaces 34—34 of fingers 25B, 25B are likewise oppositely disposed. However, as best seen in FIGS. 1 and 2, the flexible leaf portions 32 of fingers 25B, 25B are slightly longer than the flexible leaf portions of fingers 25A, 25A so that the inclined cam surfaces 34, 34 of fingers 25B, 25B are located at a position higher than the position of the cam surfaces 34 of fingers 25A, 25A. The relative axial position of the cam surface of fingers 25A and 25B function to effect the sequential operative of the respective finger pairs 25A, 25A and 25B, 25B.

To effect the sequential operation of the respective pair of fingers 25A, 25A; and 25B, 25B, an actuating means is provided. In the illustrated embodiment, the actuating means comprise a first cam actuator 35 and a second cam actuator 36. The first cam actuator 35 is slidably mounted on the upper end of the piston shaft 13A and is free to be rendered relatively movable with respect thereto. Mounted above the movable cam actuator 35 is the second cam actuator 36 and it is fixedly connected to the piston shaft 13A. A coil spring 37 seated between a shoulder 38 formed on the piston shaft 13A and the cam actuator 35 maintains a bias on the movable cam actuator 35 toward the fixed cam actuator 36. As best seen in FIGS. 2 and 3, the cam actuator 35 is provided with complementary inclined cam surfaces 35A disposed to either side thereof to engage the cam surfaces 34 of fingers 25A, 25A when the piston shaft 13A is displaced toward its upper or operative position. As the cam surfaces 35A engage cam surfaces 34 of fingers 25A, 25A as the piston shaft 13A is displaced, the gripping ends 28A, 28A of fingers 25A, 25A will close onto the workpiece attached to the end of the nozzle so as to orient the workpiece along a first axis thereof.

Cam actuator 36, which is fixed to the piston shaft 13A, is also provided with oppositely disposed cam surfaces 36A, 36A for engagement with the cam surfaces 34 of fingers 25B, 25B upon the continued upward movement of the piston shaft 13A. The arrangement of the cam actuators 35, 36 is such that the respective pairs of fingers 25A, 25A and 25B, 25B are sequentially closed onto the workpiece so that the workpiece W is first aligned along a first axis by fingers 25A, 25A, and then aligned along a second axis as fingers 25B, 25B close thereon. As it will be apparent when fingers 25A, 25A are closed upon the workpiece, the piston shaft 13A can continue its upward movement as the upper end of the piston shaft is free to move relative to the first cam actuator 35 by the compression of spring 37. With the construction described, it will be apparent that upon the actuation of the tool 10, the working motion of the respective fingers is positively maintained as the complementary cam surfaces of the actuating cam 35, 36 are always in contact with the complementary cams 34 of the associated finger pairs. Accordingly, the gripping ends of the fingers are positively maintained on the workpiece to prevent any unintentional shifting of the workpiece during the sequential operation of the respective pairs of fingers 25A, 25A and 25B, 25B.

Adjusting means are also provided to effect adjustment of the fingers and the respective movement thereof within a predetermined given range. As best seen in FIG. 3, an adjustable stop in the form of an adjusting screw 40 is provided in the upper end of the rigid portion 33 of the respective fingers. As shown, the rigid portion 33 of the respective fingers are normally biased toward the bottom of its corresponding slot 26 or end cap. By adjusting the seat screw 40, the gripping end can be adjusted within the limits of the adjustments provided by the adjusting screw 40. Each of the respective fingers is also provided with a second adjustment. As shown, the second adjustment comprises a second adjusting screw 41 threaded through the rigid portion 33 of the fingers to bear against the leaf spring portion 33 to which the finger cams 34 are connected. By adjustment of screw 41, the inclined cam 34 can be advanced or retracted relative to its complementary cam actuator to further effect a fine adjustment within the adjusting limits of screw 41. Since the described tool is to be used for precise positioning and orienting of a workpiece on the end of the nozzle, the adjustment described enhances the precision of the tool.

The operation of the described tool is as follows. When the tool 10 is positioned over the workpiece pick-up station, the negative pressure or vacuum is actuated as the nozzle end 17A is positioned opposite the workpiece W. The suction causes the workpiece to be adhered thereto. Upon picking up the workpiece W and in translating the tool to a position over a related component part, the orienting of the workpiece on the end of the nozzle is effected. This is attained by introducing fluid pressure, e.g. air pressure, into port A to effect the displacement of the piston 13 and connected piston shaft 13A. As the piston 13 is displaced upwardly, the collar 21 follows the piston due to the bias of the coil spring 12. In doing so, the nozzle 17 is moved up into the housing until the retainer or stop 19 abutts the end of the housing or bushing 18. In this position, the workpiece W, secured by negative pressure, is disposed between the opposed pairs of fingers 25A, 25A and 25B, 25B. Continued movement of the piston and connected shaft 13A causes the cam actuator 35 to engage the cams 34 of fingers 25A, 25A causing the gripping ends thereof to close on the workpiece to effect the alignment thereof along a first axis, e.g., the X axis of the workpiece. Continued motion of the piston and piston shaft 13A will then bring the second cam actuator 36 into engagement with the cams 34 of fingers 25B, 25B causing the gripping ends thereof to sequentially close onto the workpiece to effect the alignment thereof along a second axis, e.g., the Y axis of the workpiece. When both pairs of fingers are closed upon the workpiece, the workpiece is predeterminately positioned on the end of the nozzle 17 along its first and second axis. As noted, the fingers are maintained in positive engagement with respect to their respective actuating cams 35, 36 throughout the operating cycle of the respective fingers which renders any unintentional shifting of the workpiece virtually impossible. The pivoting of the respective fingers within their associated housing slot also prohibits any lateral deviation of the fingers or workpiece held therebetween. It will be understood that the actuation of the fingers can take place as the tool 10 is being translated from the feed station to the positioning station.

To position the workpiece so oriented on the end of the nozzle 17 onto a related component part, the actuating medium, i.e., compressed air, is switched from port A to port B. The introduction of the fluid medium will effect the downward displacement of the piston and connected piston shaft 13A causing the actuation of the tool 10 to reverse. Fingers 25B, 25B are gradually moved to their open or inoperative position as the actuating cam 36 is lowered. Continued lowering of the piston and connected piston shaft 13A will then cause the cam actuator 35 to effect the opening of fingers 25A, 25A. To provide for positive Z axis compliance of the nozzle and connected workpiece, as the nozzle places the workpiece W on the receiving component part, continued downward movement of the piston is permitted or allowed by the compression of spring 24. To release the part or workpiece, the vacuum pressure acting on the nozzle is released with the part in place as its related component part.

Desired adjustment of the respective fingers to accommodate any variance of tolerance or for other reasons are effected by the adjusting screws 40 and 41. By proper adjustments of screws 40 and 41, the distance between the gripping ends of the respective finger pairs can be adjusted with respect to each other and relative to the center of the nozzle 17. Adjusting screw 41 effects the presetting of the cam 34 relative to its actuating cam 35 or 36.

While the invention has been disclosed with respect to a particular embodiment thereof, variations and modifications may be made without department from the spirit or scope of the invention.

What is claimed is:

1. A tool for precisely positioning a workpiece relative to a component part comprising
a pick-up means for picking up a part and translating the workpiece for placement on a component part,
locating means on said pick-up means for locating a workpiece relative to the end of the pick-up means,
means for actuating said locating means to an operative position for predeterminately positioning a workpiece on the end of the pick-up means relative to a first and second axis thereof, and for positively maintaining said locating means on said workpiece in the operative position thereof,
and means for adjusting said locating means relative to said pick-up means to effect a predetermined precise location of a workpiece on said pick-up means along said first and second axis thereof,
said locating means comprising
a first and second pair of locator fingers pivotably mounted on said pick-up means for movement between an inoperative and operative position,
said first pair of fingers being oppositely disposed and having one end thereof disposed to opposite sides of said pick-up means for locating a workpiece along said first axis in the operative position thereof,
and said second pair of fingers being angularly disposed relative to said first pair of fingers and having one end thereof disposed to opposite sides of said pick-up means for locating a workpiece along said second axis in the operative position thereof,
said fingers each being pivotably mounted intermediate the ends thereof,
and said adjusting means being connected to the other end of the respective fingers for individually adjusting the limits of movement of said respective pairs of fingers between an operative and inoperative position thereof,
wherein each of said locator fingers having its said other end bifurcated by a longitudinally extending slit to define a flexible leaf portion and a relatively rigid portion, and said adjusting means including an adjustable stop for varying the distance between said one end of said corresponding finger and said nozzle in the inoperative position thereof.

2. A tool as defined in claim 1, said actuating means including a cam surface connected to said flexible leaf portion of each said respective fingers, and a variable set means for effecting the adjustment of said cam surface.

3. A tool as defined in claim 2, wherein the cam surfaces of one pair of said locator fingers are axially spaced from the cam surfaces of said other pair of locator fingers.

4. A tool as defined in claim 2, wherein said pick-up means includes a housing having a cylinder bore, a piston means having a piston shaft and a connector piston reciprocally mounted in said cylinder bore, a nozzle means mounted within said piston shaft and having an end portion extending between said one end of said locator fingers, and said actuating means including a first cam actuator and a second cam actuator mounted on said piston shaft in tandem whereby the first cam actuator engages the cam surfaces on one end of said pair of locator fingers, and said second cam actuator sequentially engages the cam surfaces of said other pair of locator fingers to effect sequential alignment of a workpiece along said first and second axis.

5. A tool as defined in claim 4, wherein one of said cam actuators is slidably mounted on said piston shaft for relative movement with respect thereto, and the other cam actuator is fixedly connected to said piston shaft.

6. A tool as defined in claim 4, wherein said first and second cam actuators are angularly disposed relative to one another.

7. A tool as defined in claim 4 and including means for yielding biasing said first cam actuator toward said second cam actuator.

8. A tool for precisely positioning a workpiece relative to a component part comprising
a pick-up means for picking up a workpiece and translating the workpiece for placement onto a component part,
said pick-up means including a housing having a cylinder bore,
a piston means including a piston shaft and a connected piston reciprocably mounted within said cylinder bore,
said piston shaft having a passageway extending therein,
a nozzle disposed within said passageway,
said nozzle having an end portion extending beyond the end of said housing,
means for introducing a negative pressure on the end portion of said nozzle,
means for introducing a fluid pressure into said cylinder bore for effecting the actuation of said piston and connected piston shaft within said cylinder base,
and a plurality of locator fingers circumferentially spaced about said housing,
said plurality of locator fingers including
a first pair of oppositely disposed fingers pivotably mounted intermediate the ends thereof to said housing,
and a second pair of oppositely disposed fingers pivotably mounted intermediate the ends thereof to said housing in angularly disposed relationship to said first pair of fingers,
each of said fingers having a gripping end portion for engaging a workpiece disposed adjacent the nozzle end of said housing and an actuating end portion adjacent the other end of said housing,
each of said actuating end portions of said fingers having a longitudinally slit bifurcating said actuating end portion to define a flexible leaf portion and a relatively rigid portion,
each of said flexible leaf portions having a laterally disposed inclined cam surface connected thereto,
said cam surfaces connected to said second pair of finger locators being axially spaced from the cam surfaces of said first pair of fingers,
adjusting means on said actuating ends of said locator fingers,
and actuating means for effecting sequential actuation of said respective pairs of fingers for locating a piece on the end of said nozzle along a first and second axis with respect thereto.

9. A tool as defined in claim 8, wherein said actuating means includes a first and second cam actuator mounted on said piston shaft, said first cam actuator being yeildingly mounted on said piston shaft for effecting engagement with the associated cam surfaces of said first pair of locators to cause the corresponding gripping ends of said first pair of locators to precisely locate a workpiece along a first axis, a second cam actuator fixedly connected to said piston shaft for effecting engagement with the associated cam surfaces of said second pair of locator fingers to cause the corresponding gripping ends thereof to precisely locate a workpiece along a second axis when said piston and connected piston shaft is actuated.

10. A tool as defined in claim 9, wherein said adjusting means includes a first adjustment means for adjusting the position of the respective cam surfaces relative to its corresponding cam actuator.

11. A tool as defined in claim 10, wherein said adjusting means includes a second adjustment for adjusting the position of the respective gripping ends of said respective pairs of locating fingers relative to each other.

* * * * *